United States Patent [19]

Rachor et al.

[11] Patent Number: 4,470,370
[45] Date of Patent: Sep. 11, 1984

[54] MEANS FOR LOADING VAPOR COATING MATERIALS INTO AN EVAPORATOR

[75] Inventors: Lothar Rachor, Hanau; Erwin Eichinger, Leinzell; Peter Scheyrer, Schwabisch Gmund; Rudolf Seif, Bruchkobel, all of Fed. Rep. of Germany

[73] Assignee: GfO - Gesellschaft für Oberflächentechnik m.b.H., Schwabisch Gmund, Fed. Rep. of Germany

[21] Appl. No.: 435,601

[22] Filed: Oct. 20, 1982

[30] Foreign Application Priority Data

Jan. 14, 1982 [DE] Fed. Rep. of Germany ....... 3200848

[51] Int. Cl.³ ............................................. C23C 13/12
[52] U.S. Cl. ..................................... 118/726; 266/200
[58] Field of Search ............... 118/726, 727, 718, 715; 266/207, 265, 200; 414/680

[56] References Cited

U.S. PATENT DOCUMENTS

| 2,635,579 | 4/1953 | Chadsey, Jr. ........................ 118/726 |
| 2,996,037 | 8/1961 | Eng ................................. 118/733 X |
| 3,227,133 | 1/1966 | Anderson et al. ............. 118/727 X |
| 4,226,208 | 10/1980 | Nishida et al. ........................ 118/733 |

FOREIGN PATENT DOCUMENTS 1032998 6/1958 Fed. Rep. of Germany .
1298833 7/1969 Fed. Rep. of Germany .
1910332 9/1970 Fed. Rep. of Germany .

Primary Examiner—John D. Smith
Assistant Examiner—Bernard F. Plantz
Attorney, Agent, or Firm—Cushman, Darby & Cushman

[57] ABSTRACT

For the loading of evaporators in vapor coating plants with shaped pieces made of vapor coating materials there is used an apparatus which is characterized by rolls having indentations for receiving the shaped pieces, centered on a rotatable shaft and surrounded by a closely fitting housing by a moving part having gradual feed fastened on the shaft and by a swivelable shaft moveable into a resting position and into a loading position, on which there is mounted the shaft having rolls via fastening elements. Thereby the housing of the rolls is provided with a recess corresponding to the shaped pieces, which is located in the loading position directly above the evaporator. Because there is only a short time loading process there is no need to cool and there is avoided influencing of the vaporization by the action of moving.

4 Claims, 1 Drawing Figure

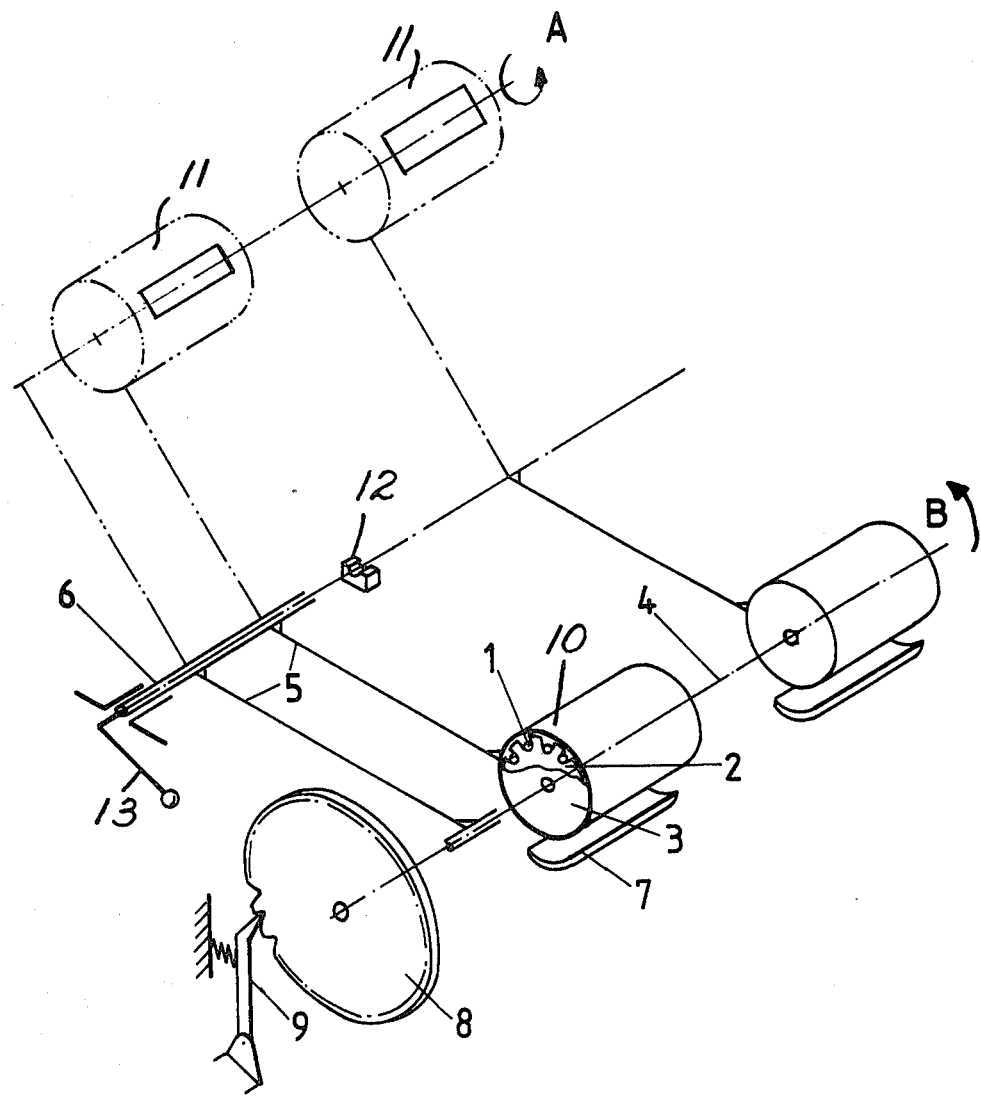

MEANS FOR LOADING VAPOR COATING MATERIALS INTO AN EVAPORATOR

BACKGROUND OF THE INVENTION

The invention is directed to an apparatus for the loading of evaporators (vaporizers) in vapor coating plants with shaped pieces of vapor coating materials.

Thin layers of materials, especially metals can be obtained in a relatively simple manner by vaporizing the corresponding materials in a vacuum and depositing the vapors formed on the corresponding substrates. Thereby the vaporization of the materials to be applied takes place in so-called evaporators by heating or also by means of electron beams.

The vapor coating of thin layers on limited surfaces with a homogeneous vapor coating materials is relatively simple. Complicated apparatuses are necessary in the vapor deposition of continuous belts, in the vapor coating of alloy layers or several layers of different materials, above all on account of the continuous loading of the evaporator with the vapor coating materials without breaking the vacuum, which would lead to deterioration of the quality of the layer. In breaking the vacuum for the purpose of new loading of the evaporator there is the difficulty that a multiple pumping out of the vapor coating plant is uneconomical.

It is known to apply coatings made of several components on substrates by vapor coating in a vacuum by bringing the substrate successively over evaporators having the corresponding materials (German OS 1910332). However, this process and apparatus can only operate with a limited amount of vapor coating materials. The same disadvantages occur if evaporators with different vapor coating materials are arranged on a rotatable plate (indexable table) and are heated successively (German AS 1298833).

Furthermore, there are known apparatus with which the vapor coating materials can be supplied continuously to the evaporators during the vapor coating process or while maintaining the vacuum. Thus for example, in German patent 752141 the vapor coating material in wire form is drawn off from a supply roll and supplied directly to heated crucible evaporator, where it is vaporized and is deposited on the substrate. Besides it is known from German AS 1032998 to allow the materials to be vaporized to fall in the form of small particles through a suitable apparatus on the highly heated evaporator. However, these loading apparatuses have the disadvantage that they must be cooled separately because of the high heat load in the plant and in the vapor coating can cast disturbing "shadows".

Therefore it was the problem of the present invention to provide an apparatus for loading evaporators in vapor coating plants having shaped pieces made of vapor coating materials with which the evaporator can be repeatedly loaded without breaking the vacuum, without there being required a special cooling and without there occurring a "casting of shadows".

SUMMARY OF THE INVENTION

This problem is solved according to the invention by providing an apparatus for receiving shaped pieces having rolls with indentations for receiving the shaped pieces, said rolls being centered on a rotatable shaft and surrounded by a closely fitting housing, a moving part having gradual feed fastened on the shaft and by a swivelable shaft moveable into a resting position and into a loading position, on which there is mounted the shaft having rolls via fastening elements, whereby the housing of the rolls is provided with a recess corresponding to the shaped pieces, which is located in the loading position directly above the evaporator.

As molded articles (shaped pieces) there can be used for example, platelets, spheres or preferably wire segments whereby these at times can consist of the same materials or in the production of different coatings of several vapor coating materials.

In case the vapor coating plant has several evaporators it is of advantage to arrange for each evaporator its own loading roll which either rest on the same or on different shafts. The moving part is preferably constructed as a ratchet wheel which in swiveling the swivelable shaft into the loading position locks into a stationary ratchet and the shaft with the loading roll at times further moves around one position.

Besides it is advantageous to bring the moveable shaft out of the vapor coating plant in hermetically sealed manner and to provide it with a mechanical drive outside the plant.

The apparatus can comprise, consist essentially of, or consist of the stated parts.

BRIEF DESCRIPTION OF THE DRAWINGS

The single FIGURE of the drawings schematically shows an illustrative form of the apparatus of the drawing.

DETAILED DESCRIPTION

Referring more specifically to the drawings rolls 2 rest on a rotatable shaft 4, which rolls are provided on their periphery with indentations 10 for receiving the shaped pieces 1 made of the corresponding vapor coating materials and are surrounded by a housing 3. The rotatable shaft 4 and in a given case, also the housing 3 are connected via fastening elements 5 with a swivelable shaft 6, which is led into bearings 12 and by means of a mechanical drive for example, a lever 13 outside the plant can be swiveled into a resting position (A) and a loading position (B). There is disposed on the rotatable shaft 4 a gear 8 having gradual feed, in the present case, a ratchet wheel, which upon swiveling of the shaft 6 into the loading position (B), is engaged by a stationary ratchet 9 whereby the rotatable shaft 4 corresponding to the tooth interval of the ratchet wheel 8 turns around one position as shaft 4 moves in position 3. Then a shaped article falls through the recess 11 in the housing 3 of the rolls from the indentation 10 of the rolls 2 into the evaporator 7. Subsequently the swivelable shaft 6 is brought again into the resting position (A) where it cannot impair the vapor coating by the "shadow" effect and also there is no exposure to extreme heating action which would make necessary a cooling. The loading with heated evaporators 7 can take place because of the only short time stay of the rolls 2 on the evaporators 7.

The entire disclosure of German priority application P 3200848.1 is hereby incorporated by reference.

What is claimed is:

1. An apparatus suitable for loading the evaporators in a vapor coating plant with shaped pieces made of vapor coating materials comprising, in combination an evaporator, roll means having a plurality of indentations, each adapted to receive a shaped piece, said roll means being mounted on a first rotatable shaft and surrounded by a closely fitting housing, gradual feed means fastened on said first shaft and a second swivelable shaft connected to said first shaft for moving said first shaft between a resting position and a loading position, said housing having a recess corresponding to the shaped pieces, said recess being located in the loading position directly above the evaporator, said gradual feed means including a ratchet wheel fastened on said first shaft, said apparatus also including a stationary ratchet with said stationary ratchet engaging said ratchet wheel when said roll means is moved to said loading position whereby a said indentation is moved adjacent said recess of said housing to permit discharge of a said shaped piece of vapor coating material from said roll means to said evaporator.

2. An apparatus for loading evaporators according to claim 1 where said first shaft has mounted on it a plurality of rolls corresponding to a number of evaporators.

3. An apparatus for loading evaporators according to claim 2 when the second shaft is driven by means outside of the vapor coating plant.

4. An apparatus for loading evaporators according to claim 1 when the second shaft is driven by means outside of the vapor coating plant.